US011056650B2

(12) United States Patent
Kang et al.

(10) Patent No.: US 11,056,650 B2
(45) Date of Patent: Jul. 6, 2021

(54) FILM OF QUANTUM DOT, METHOD FOR PATTERNING THE SAME AND QUANTUM DOT LIGHT EMITTING DEVICE USING THE SAME

(71) Applicants: FOUNDATION OF SOONGSIL UNIVERSITY-INDUSTRY COOPERATION, Seoul (KR); SOGANG UNIVERSITY RESEARCH & BUSINESS DEVELOPMENT FOUNDATION, Seoul (KR)

(72) Inventors: Moon Sung Kang, Seoul (KR); Jeong Ho Cho, Seoul (KR); Jee Hye Yang, Bucheon-si (KR)

(73) Assignees: Foundation of Soongsil University-Industry Cooperation, Seoul (KR); Sogang University Research & Business Development Foundation, Seoul (KR)

( * ) Notice: Subject to any disclaimer, the term of this patent is extended or adjusted under 35 U.S.C. 154(b) by 0 days.

(21) Appl. No.: 16/377,885

(22) Filed: Apr. 8, 2019

(65) Prior Publication Data
US 2019/0312204 A1    Oct. 10, 2019

(30) Foreign Application Priority Data
Apr. 9, 2018 (KR) .................. 10-2018-0040804

(51) Int. Cl.
*H01L 51/00* (2006.01)
*H01L 51/50* (2006.01)
(52) U.S. Cl.
CPC ...... *H01L 51/0018* (2013.01); *H01L 51/0003* (2013.01); *H01L 51/502* (2013.01); *H01L 51/504* (2013.01)

(58) Field of Classification Search
CPC ............. H01L 51/0018; H01L 51/0003; H01L 51/502; H01L 51/504; H01L 2251/5376;
(Continued)

(56) References Cited

U.S. PATENT DOCUMENTS

2009/0116020 A1* 5/2009 Wu .................. G01N 33/54373
356/445
2017/0358759 A1* 12/2017 Lee ..................... H01L 51/0077
(Continued)

FOREIGN PATENT DOCUMENTS

CN         105070849 A    11/2015
KR      1020100023359 A    3/2010

OTHER PUBLICATIONS

Bis(perfluorophenyl) Azides_ Effect Cross-Linking Agents for Deep-UV and Electron Beam Lithography, Chemistry of Materials, 2(6) (1990), 631-633.
(Continued)

*Primary Examiner* — Shahed Ahmed
(74) *Attorney, Agent, or Firm* — Greer, Burns & Crain, Ltd.

(57) ABSTRACT

The present disclosure provides a quantum dot thin film that is formed by cross-linking ligands of quantum dots with a photo cross-linker containing two or more azide groups. According to still another aspect of the present disclosure, a method for forming a quantum dot pattern includes: forming a quantum dot layer on a substrate by coating the substrate with a solution including quantum dots and a photo cross-linker containing two or more azide groups; placing a mask having a pattern on the quantum dot layer and performing UV exposure on the quantum dot layer; and forming a quantum dot pattern by removing a non-exposed region of the quantum dot layer.

9 Claims, 13 Drawing Sheets

(58) Field of Classification Search
CPC . H01L 51/50–56; H01L 51/0032–0095; H01L 27/32–3297; H01L 2251/50–568; H01L 2251/5369; H01L 51/5012; H01L 51/56
See application file for complete search history.

(56) References Cited

U.S. PATENT DOCUMENTS

| | | | |
|---|---|---|---|
| 2018/0102093 A1* | 4/2018 | Kim | G09G 3/3258 |
| 2018/0133345 A1* | 5/2018 | Naasani | C07K 16/2863 |
| 2019/0143584 A1* | 5/2019 | Hanrath | B29C 64/124 |
| | | | 264/401 |
| 2019/0243050 A1* | 8/2019 | Rao | C09K 11/02 |

OTHER PUBLICATIONS

High-performance polymer semiconducting heterostructure devices by nitrene-mediated photocrosslinking of alkyl side chains, Nature Materials, 9 (2010), 152-158.
Evaluation of bis(perfluorophenyl azide)s as cross-linkers for a soluble polyimide, J. Mater. Chem., 6(8) (1996), 1249-1252.
Use of Florinated Maleimide and Telechelic Bismaleimide for Original Hydrophobic and Oleophobic Polymerized Networks, Journal of Polymer Science, Part A, 46(10) (2008), 3214-3228.
Facile synthesis of diazo-functionalized biaryl compounds as radio-isotope-free photoaffinity probes by Suzuky-Miyaura coupling, Bioorganic & Medicinal Chemistry, 17 (2009), 2490-2496.
Proton Conducting Sulphonated Fluorinated Poly(Styrene) Cross-linked Eletrolyte Membranes, Fuel Cells, 11(5) (2011), 611-619.
Crosslinking poly(1-trimethylsilyl-1-propyne) and its effect on solvent resistance and transport properties, Polymer, 48 (2007), 6881-6891.
Dual Function Additives a Small Molecule Crosslinker for Enhanced Efficiency and Stability in Organic Solar Cells, Advanced Energy Materials, 5(9) (2015), 1401426.
Synthesis of Semiconductor Nanocrystals, Focusing on Nontoxic and Earth-Abundant Materials, Chemical Reviews, 116(18) (2016), 10731-10819.
InP@ZnSeS, Core@Composition Gradient Shell Quantum Dots with Enhanced Stability, Chem. Mater., 23 (2011), 4459-4463.
Influence of Shell Thickness on the Performance of LightEmittingDevices Based on CdSeZn1XCdXS CoreShell Heterostructured Quantum Dots, Adv.Mater., 26 (2014), 8034-8040.
Photopolymers: Photoresist Materials, Process, and Applications, K. Nakamura, CRC Press (2014).

* cited by examiner

FIG. 3B

| Structure | Name |
|---|---|
| | [bis(perfluorophenyl) azides; Bis-FB-N₃] |
| | [(3S,4S)-3,4-diazido-1-(phenylmethyl)pyrrolidine] |
| | [1,2-diazidoethane] |
| | [1,4-diazido benzene] |
| | [1,6-Diazidohexane] |
| | [1,1'-methylenebis(4-azidobenzene)] |
| | [4,4'-diazidodiphenyl ethane] |
| | [(3R,4R)-(−)-3,4-diazido-1-(phenylmethyl)-pyrrolidine] |
| | [2,6-bis-(4-azidobenzylidene)cyclohexanone] |

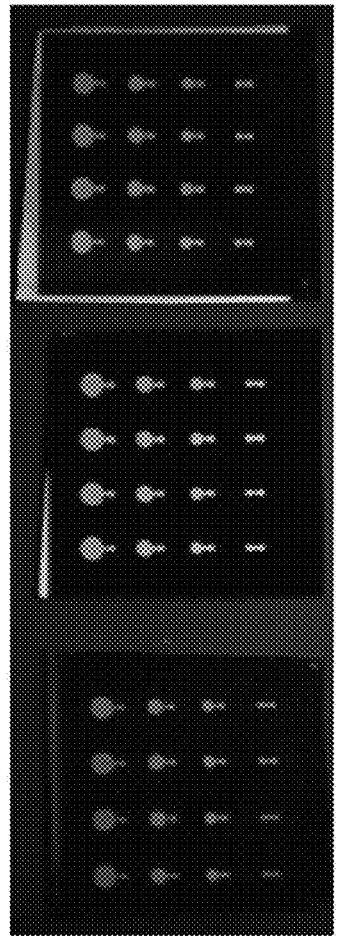
FIG. 8A  Cd based Red QD (5 wt%, UV 5 sec)
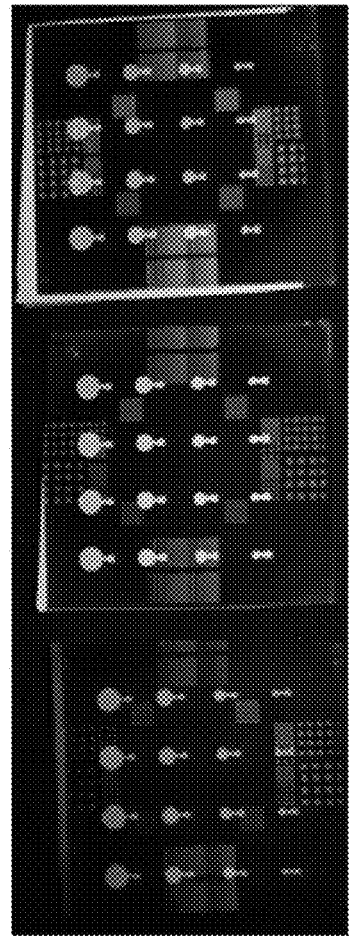
FIG. 8B  + InP based Green QD (10 wt%, UV 10 sec)
[2,6-bis-(4-azidobenzylidene) cyclohexanone]   [4,4'-diazidodiphenyl ethane]   [bis(perfluorophenyl) azides; Bis-FB-N₃]

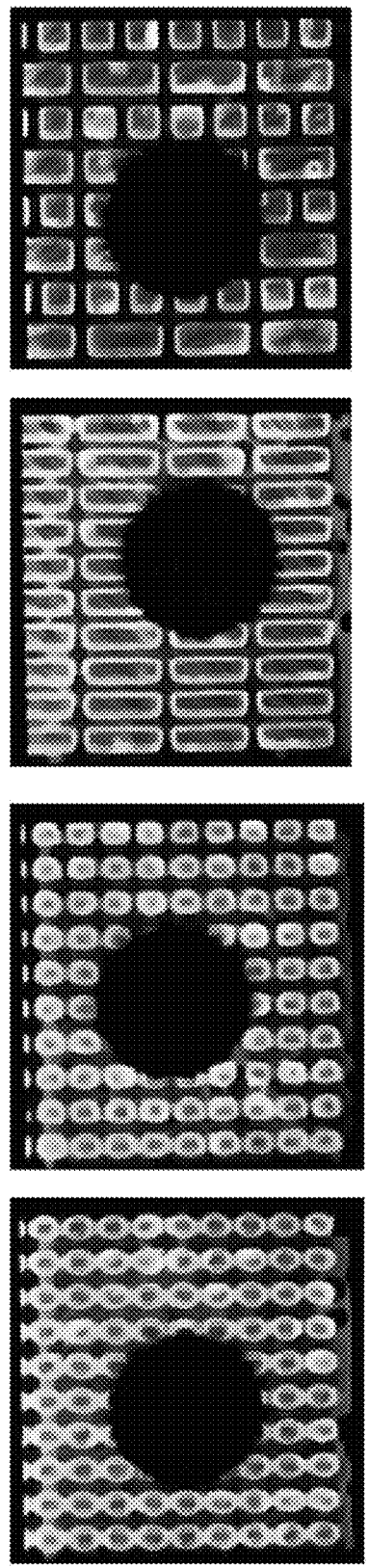

FILM OF QUANTUM DOT, METHOD FOR PATTERNING THE SAME AND QUANTUM DOT LIGHT EMITTING DEVICE USING THE SAME

CROSS-REFERENCE TO RELATED APPLICATION

This application claims the benefit under 35 USC 119(a) of Korean Patent Application No. 10-2018-0040804 filed on Apr. 9, 2018 in the Korean Intellectual Property Office, the entire disclosures of which are incorporated herein by reference for all purposes.

TECHNICAL FIELD

The present disclosure relates to a quantum dot thin film, a method for patterning the same, and a quantum dot light emitting device using the same.

BACKGROUND

A display, as a means of interaction between an electronic device and a user, has evolved from cathode-ray tubes in the 60's into flat displays such as LCD and further into next-generation displays such as OLED, flexible displays, transparent displays, and the like. As the display market expands, the demand for displays with high luminance, low power consumption, high integration, and high color reproduction has been increased in the market.

A quantum dot display is expected as a display capable of satisfying the above market demands including high luminance, low power consumption, high color reproduction, and the like. Therefore, recently, light emitting devices using the excellent light emitting properties (high color purity, color control according to the size) of quantum dots have been developed. However, quantum dot displays currently on the market do not use a thin film including a quantum dot RGB pattern, but they are non-self-luminous displays using a blue back light unit and just an application of quantum dots to a back light unit.

In order to implement a quantum dot display capable of satisfying the above market demands, a technique for patterning a quantum dot thin film on a substrate for each of RGB colors is needed. In recent years, various patterning techniques such as inkjet printing, transfer printing, photolithography, and the like have been attempted to form a quantum dot RGB pattern.

However, these patterning techniques require a separately manufactured mold and may need a microstructure printing device or additional processes such as forming and removing photoresist, which may result in an increase in manufacturing cost or complexity. Further, inkjet printing and stamp transfer printing for quantum dot patterning require a microstructure nozzle or a substrate which includes a micropattern or whose surface is modified separately, which may result in increased manufacturing complexity and low economic feasibility. These patterning techniques make it difficult to implement a high-resolution or high-efficiency quantum dot display.

SUMMARY

In view of the foregoing, the present disclosure provides a quantum dot thin film to be used for providing a quantum dot light emitting device with high luminance, low power consumption, high integration, and high color reproduction and a substrate on which the quantum dot thin film is patterned.

According to an aspect of the present disclosure, a quantum dot thin film is formed by cross-linking ligands of quantum dots with a photo cross-linker containing two or more azide groups.

According to another aspect of the present disclosure, a substrate on which a quantum dot pattern is formed includes a quantum dot thin film patterned with a first quantum dot pattern, a second quantum dot pattern, and a third quantum dot pattern on the substrate, and the quantum dot thin film is formed by cross-linking ligands of quantum dots with a photo cross-linker containing two or more azide groups.

According to yet another aspect of the present disclosure, a quantum dot light emitting device includes a first electrode, a second electrode spaced from the first electrode, and a quantum dot thin film according to claim 1 which is located between the first electrode and the second electrode.

According to still another aspect of the present disclosure, a method for forming a quantum dot pattern includes: forming a quantum dot pattern on a substrate by coating the substrate with a solution including quantum dots and a photo cross-linker containing two or more azide groups; placing a mask having a pattern on the quantum dot film and performing UV exposure on the quantum dot film; and forming a quantum dot pattern by removing a non-exposed region of the quantum dot film.

According to the present disclosure, in the method for patterning a quantum dot thin film and the quantum dot light emitting device using the same, azide groups ($-N_3$) in the photo cross-linker are activated to nitrene groups ($-N$:) by UV exposure and then bound to alkyl ($C-H$) ligands surrounding a quantum dot. According to the method of the present disclosure, any material containing a carbon-hydrogen ($C-H$) bond can be photo cross-linked and thus can be patterned through a simple solution process.

Further, the process is simple and economical and thus can be applied to various fields such as semiconductor, display, solar cell, light emitting diode, organic light emitting diode, organic/inorganic transistor, and the like.

Besides, according to the method of the present disclosure, multicolor RGB quantum dot thin films can also be patterned by repeating the simple solution method. This makes it possible to implement a thin and flexible display based on electroluminescence of QD pixels, without a separate back light unit or color filter. The patterned RGB quantum thin film can also be used as a color filter of an LCD display.

Furthermore, according to the method of the present disclosure, the RGB quantum thin film can be patterned with high resolution, and while the second and third quantum dot films are patterned after the first quantum dot pattern is formed, the first quantum dot pattern can be well maintained.

Surprisingly, the present inventors have found that the thin film including the quantum dot pattern photo cross-linked by the method of the present disclosure has an increased luminous efficiency compared to a quantum dot thin film which is not photo cross-linked.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A shows first to third quantum dot patterns placed in parallel not to overlap each other on the same layer, FIG. 1B shows first to third quantum dot patterns laminated vertically, and FIG. 1C shows first to third quantum dot patterns of which two or more patterns are placed in parallel on the same layer and the other pattern is laminated on the two or more patterns.

FIG. 3B shows examples of photo cross-linkers available on the market.

FIG. 5A shows a first quantum dot layer formed by casting a first quantum dot solution on a substrate, FIG. 5B shows the alignment of a first mask on the first quantum dot layer and the UV irradiation, FIG. 5C shows a first quantum dot pattern after developing, FIG. 5D shows a second quantum dot layer coated on the substrate on which the first quantum dot pattern has been formed, FIG. 5E shows a second mask on the second quantum dot layer, FIG. 5F shows a second quantum dot pattern whose exposed region is hardened by cross-linking, FIG. 5G shows a third quantum dot layer coated on the substrate on which the first and second quantum dot patterns have been formed, and FIG. 5H shows a third quantum dot pattern of which a region exposed using a third mask on the third quantum dot layer is hardened by photo-crosslinking.

FIG. 7A shows a quantum clot pattern formed using bis(perfluorophenyl azide) as a photo cross-linker, FIG. 7B shows a quantum dot pattern formed using 4,4'-diazidodiphenylethane as a photo cross-linker, and FIG. 7C shows a quantum dot pattern formed using 2,6-bis(4-azido benzylidene)cyclohexanone as a photo cross-linker.

FIG. 8A shows fluorescence microscopy images of three quantum dot single-layer patterns formed using red emissive cadmium selenide quantum dots and three different photo cross-linkers, respectively, and FIG. 8B shows fluorescence microscopy images of three quantum dot laminated patterns respectively formed using green emissive indium phosphide quantum dots and the three different photo cross-linkers on the three quantum dot single-layer patterns shown in FIG. 8A.

FIG. 9A to FIG. 9D are electroluminescence images of a green emissive indium phosphide quantum dot based light emitting device manufactured using a quantum dot thin film including patterns of various shapes in accordance with various embodiments described herein, and specifically, FIG. 9A shows a circular pattern, FIG. 9B shows a square pattern, FIG. 9C shows a rectangular pattern, and FIG. 9D shows a mixture of a rectangular pattern and a square pattern.

DETAILED DESCRIPTION

Figure 1A:
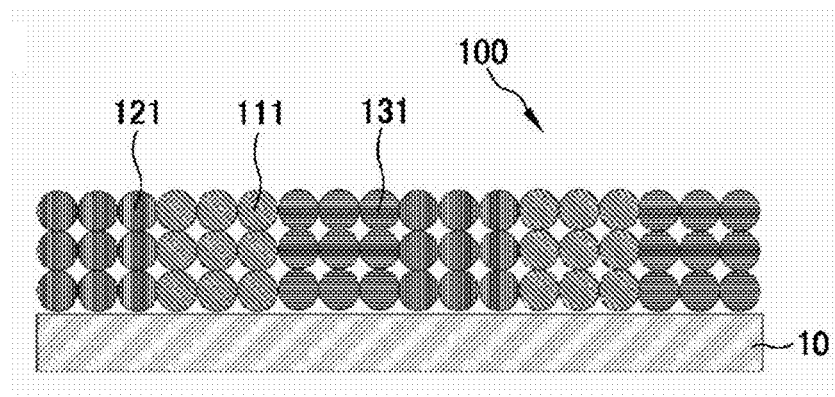
FIG. 1A to FIG. 1C are cross-sectional views of a quantum dot thin film in accordance with various embodiments described herein, and specifically.

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise.

Figure 1B:
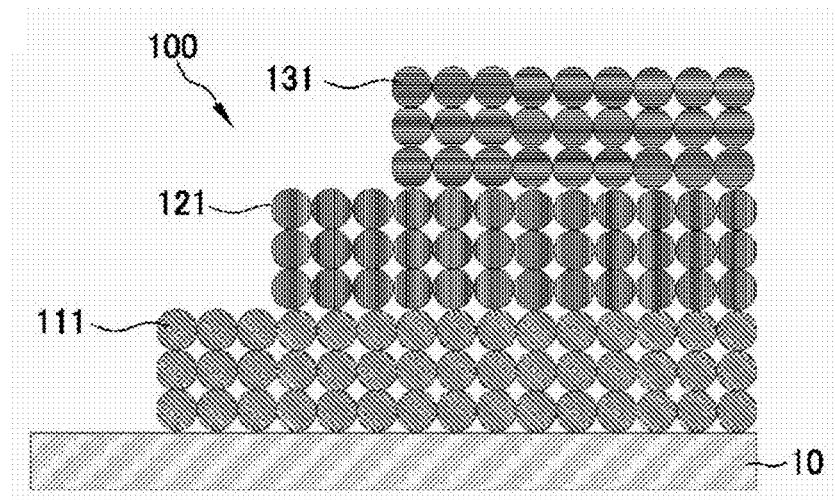
Figure 1C:
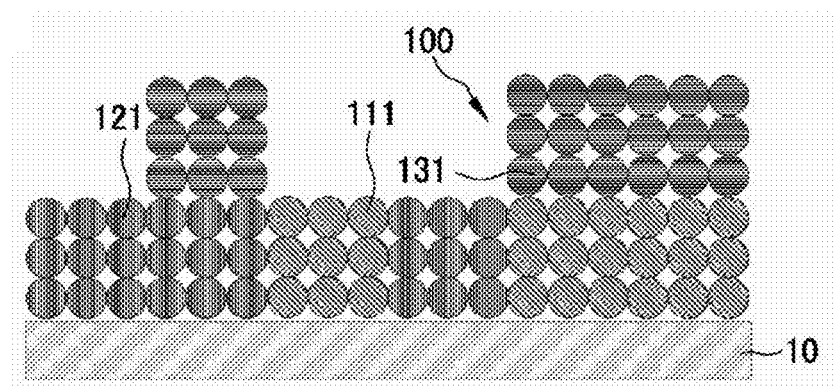

FIG. 1A to FIG. 1C are cross-sectional views of a quantum dot thin film in accordance with various embodiments described herein, and specifically, FIG. 1A shows first to third quantum dot patterns placed in parallel not to overlap each other on the same layer, FIG. 1B shows first to third quantum dot patterns laminated vertically, and FIG. 1C shows first to third quantum dot patterns of which two or more patterns are placed in parallel on the same layer and the other pattern is laminated on the two or more patterns.

Figure 2:
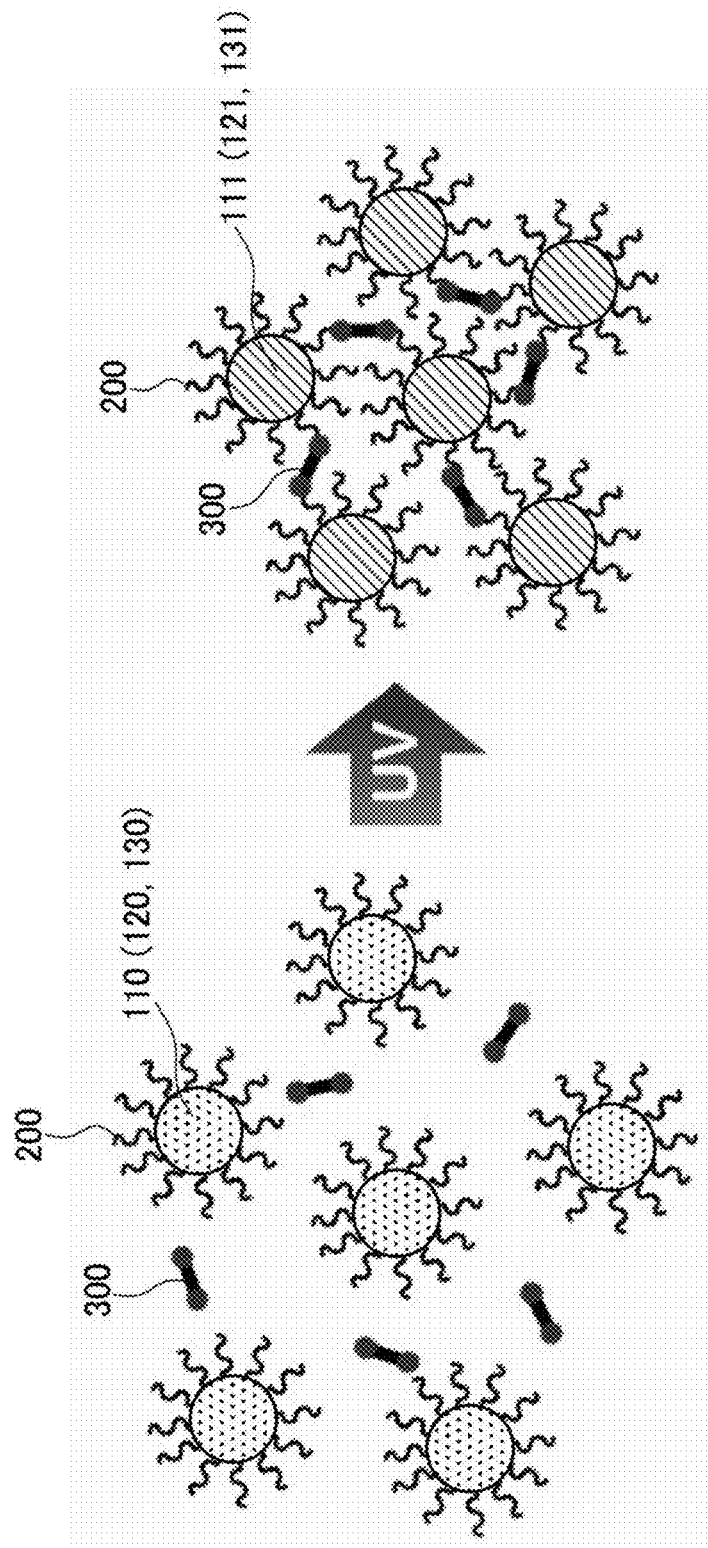
FIG. 2 is conceptual diagrams illustrating the principle of photo cross-linking for bonding quantum dot ligands with a photo cross-linker in accordance with various embodiments described herein.

FIG. 2 is conceptual diagrams illustrating the principle of photo cross-linking for bonding quantum dot ligands with a photo cross-linker in accordance with various embodiments described herein, and specifically, the left side of FIG. 2 illustrates that a photo cross-linker is located between quantum dot ligands present in a quantum dot film before UV exposure and the right side of FIG. 2 illustrates that the photo cross-linker is bound to the quantum dot ligands by UV exposure and hardened into a quantum dot pattern.

Figure 3A:
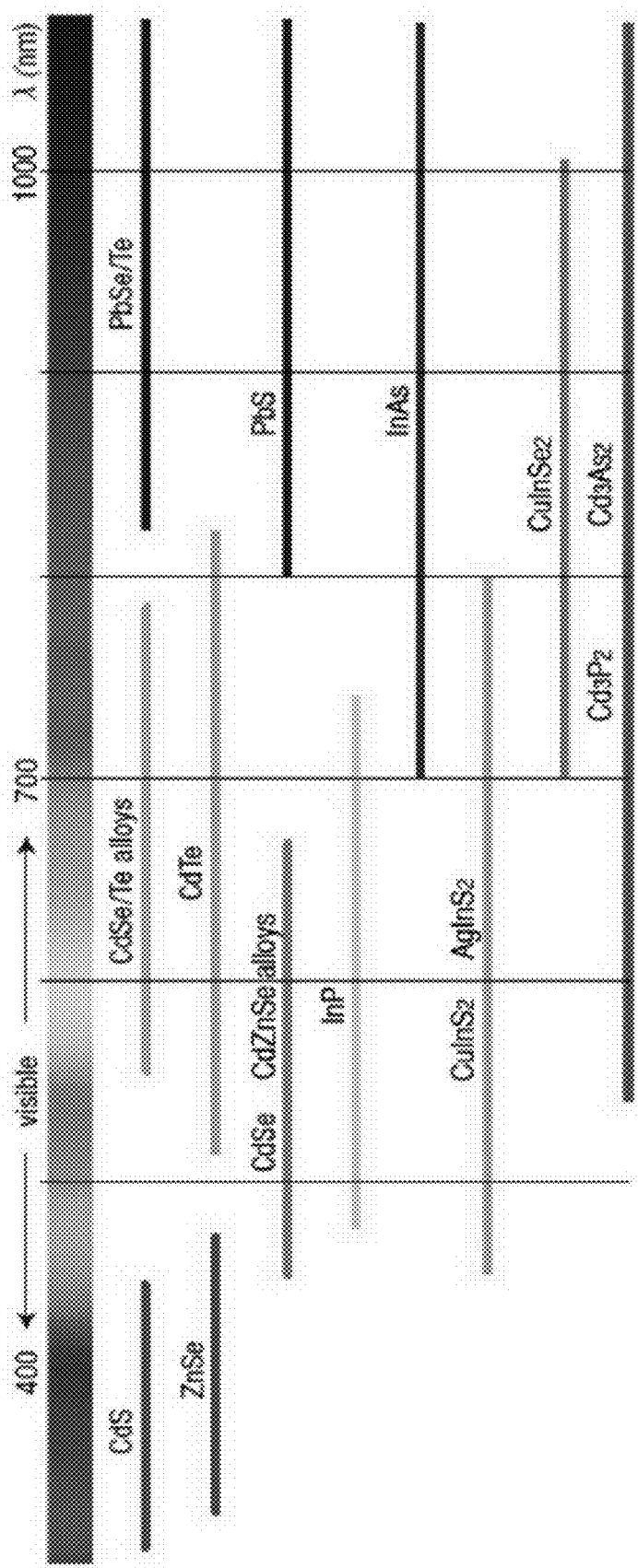
FIG. 3A is a table showing the kinds of R, G, and B quantum dots

FIG. 3A is a table showing the kinds of R, G, and B quantum dots and FIG. 3B shows examples of photo cross-linkers available on the market.

Referring to FIG. 1A to FIG. 1C, a substrate 10 including a quantum dot pattern in accordance with various embodiments described herein includes a quantum dot thin film 100 patterned with a first quantum dot pattern 111, a second quantum dot pattern 121, and a third quantum dot pattern 131 on the substrate 10. The quantum dot thin film 100 is formed by cross-linking ligands of quantum dots with a photo cross-linker containing two or more azide groups. For example, the first to third quantum dot patterns may be prepared by repeating cycles of quantum dot patterning process using a series of mixture solutions containing one of the first to third semiconductor quantum dot solutions dissolved in a hydrophobic solvent and the photo-crosslinking agent solution. That is, the first to third quantum dot solutions refer to mixtures of the photo cross-linker containing azide groups with first to third quantum dots, respectively. Herein, the first quantum dot pattern 111, the second quantum dot pattern 121, and the third quantum dot pattern 131 may be sequentially patterned adjacent and parallel to each other on the same layer on the substrate 10. For example, as shown in FIG. 1A, the first to third quantum dot patterns 111, 121, and 131 may be placed in parallel not to overlap each other on the same layer, but may not be limited thereto. As shown in FIG. 1B, the first to third quantum dot patterns 111, 121, and 131 may be laminated vertically on the substrate 10. Further, as shown in FIG. 1C, the first and second patterns 111 and 121 may be placed in parallel on the same layer on the substrate 10 and the third quantum dot pattern 131 may be formed on the first and second patterns 111 and 121.

The first to third quantum dot patterns 111, 121, and 131 may include the first to third quantum dots, respectively. The first to third quantum dots may emit light of red (R), green (G), and blue (B) colors, respectively, and have different particle sizes. That is, the first to third quantum dot patterns 111, 121, and 131 may emit light of RGB colors, respectively, by varying fluorescence depending on the particle size.

Referring to FIG. 2, the first to third quantum dot patterns 111, 121, and 131 are formed by bonding a photo cross-linker 300 between two or more quantum dot ligands 200 present in the first to third quantum dot solutions 110, 120, and 130, respectively, as shown in the left side of FIG. 2. That is, as shown in the right side of FIG. 2, azide groups contained in the photo cross-linker 300 are activated to nitrene groups by UV exposure and then bound to the ligands 200 surrounding a quantum dot and thus hardened into the first to third quantum dot patterns 111, 121, and 131. Accordingly, unlike a conventional method of hardening quantum dot films through exchanging the surface ligands of a quantum dot with shorter molecules, the method of the present disclosure can increase a distance between quantum dots. Therefore, the quantum dot thin film 100 can have an increased luminous efficiency.

According to the present disclosure, a surface-treated substrate or a patterned mold for a quantum dot pattern is unnecessary, and only a patterned mask is required. Further, an additional process for applying high temperature or high pressure to harden the pattern is not needed, which results in the simplification of a manufacturing process and the reduction of manufacturing costs.

Further, a photo cross-linked quantum dot pattern has chemical resistance, and, thus, quantum dot patterns can be formed in adjacent regions at the same time through the same photo cross-linking method. Details of the method for patterning a quantum dot thin film will be described later with reference to FIG. 4 to FIG. 5H.

The photo cross-linker containing azide groups as used in the present disclosure is not particularly limited as long as it contains two or more azide groups. For example, bisazide compounds represented by $N_3$-(linker group)-$N_3$ can be used. Herein, the linker group may include any group. For example, the bisazide compounds described in the theses "Bis(perfluorophenyl) Azides: Effect Cross-Linking Agents for Deep-UV and Electron Beam Lithography, *Chemistry of Materials*, 2(6) (1990), 631-633," "High-performance polymer semiconducting heterostructure devices by nitrene-mediated photocrosslinking of alkyl side chains, *Nature Materials*, 9 (2010), 152-158," "Evaluation of bis (perfluorophenyl azide)s as cross-linkers for a soluble polyimide, *J. Mater. Chem.*, 6(8) (1996), 1249-1252," "Use of Florinated Maleimide and Telechelic Bismaleimide for Original Hydrophobic and Oleophobic Polymerized Networks, *Journal of Polymer Science, Part A*, 46(10) (2008), 3214-3228," "Facile synthesis of diazo-functionalized biaryl compounds as radioisotope-free photoaffinity probes by Suzuky-Miyaura coupling, *Bioorganic & Medicinal Chemistry*, 17 (2009), 2490-2496," "Proton Conducting Sulphonated Fluorinated Poly(Styrene) Crosslinked Eletrolyte Membranes, *Fuel Cells*, 11(5) (2011), 611-619," "Crosslinking poly(1-trimethylsilyl-1-propyne) and its effect on solvent resistance and transport properties, *Polymer*, 48 (2007), 6881-6891" and "Dual Function Additives: A Small Molecule Crosslinker for Enhanced Efficiency and Stability in Organic Solar Cells, *Advanced Energy Materials*, 5(9) (2015), 1401426" and the book "Photopolymers: Photoresist Materials, Process, and Applications, K. Nakamura, CRC Press (2014)" can be used as the photo cross-linker for quantum dot patterning of the present disclosure.

Among these photo cross-linkers, the materials shown in FIG. 3B are examples of photo cross-linkers easily available on the market.

The photo cross-linker 300 of the present disclosure has optical properties of absorbing light in a deep-UV (DUV) range (desirably, 200 nm to 300 nm) and thus can absorb DUV light efficiently and induce photo cross-linking even in small amounts.

Quantum dots emitting red (R), green (G) and blue (B) colors are well known. For example, the luminescence quantum dots made of elements shown in FIG. 3A can be used with various surface ligands and dissolved in various solvents In the present disclosure, the ligands can be generally used ligands and may specifically include ligands such as 1-dodecanethiol, 3-mercaptopropionic acid, trioctylphosphine, trioctylphosphine oxide, oleic acid and primary amines such as oleylamine.

Further, in the present disclosure, the solvents may employ general organic solvents and specifically may include, for example, chloroform, toluene, octane, heptane, hexane, pentane, tetrahydrofuran, and chlorobenzene.

The research article "Synthesis of Semiconductor Nanocrystals, Focusing on Nontoxic and Earth-Abundant Materials, *Chemical Reviews*, 116(18) (2016), 10731-10819", Korean Patent No. 10-0678285 and Korean Patent Laid-open Publication No. 10-2014-0063435 can be referred to for the quantum dots and the ligands.

Hereafter, a method for patterning a quantum dot thin film of the present disclosure will be described in detail with reference to FIG. 4 to FIG. 5H. A detailed description of components identical in function to those described above with reference to FIG. 1A to FIG. 3B will be omitted.

Figure 4:
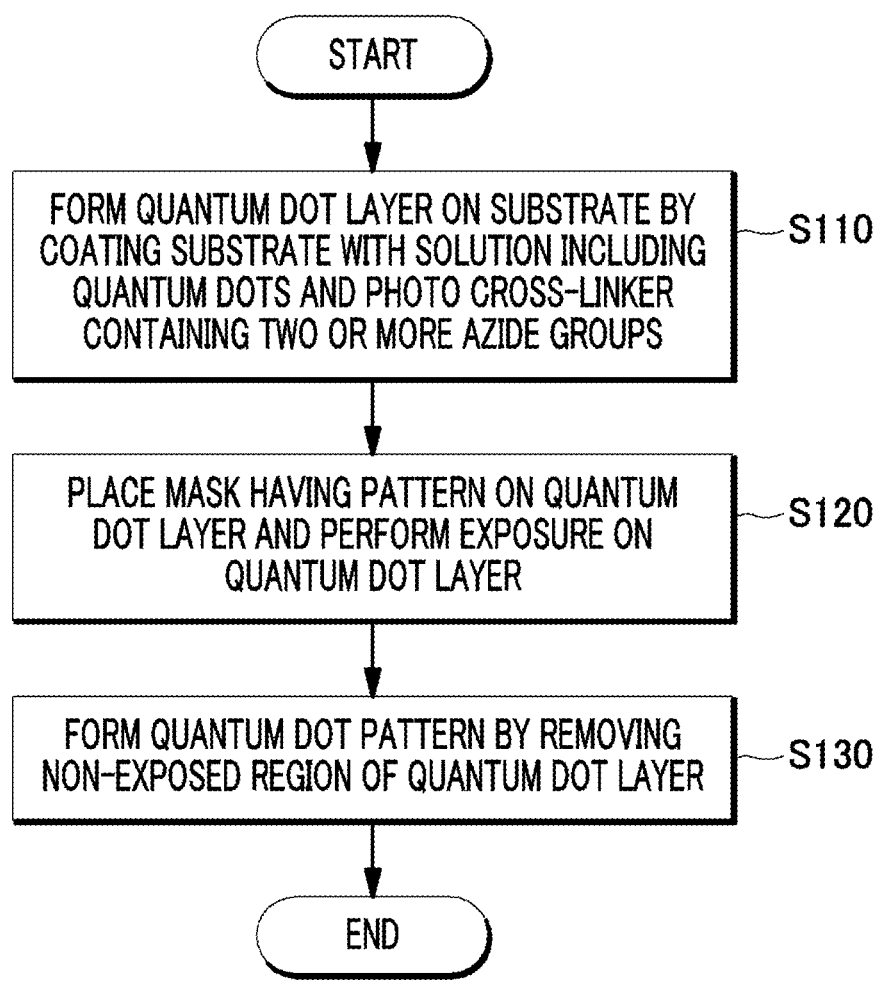
FIG. 4 is a flowchart showing a method for patterning a quantum dot thin film in accordance with various embodiments described herein.

FIG. 4 is a flowchart showing the method for patterning a quantum dot thin film in accordance with various embodiments described herein.

Referring to FIG. 4, the method for forming a quantum dot pattern film in accordance with various embodiments described herein includes: forming a quantum dot layer on the substrate 10 by coating the substrate 10 with a mixture solution including quantum dots and a photo cross-linker containing two or more azide groups (S110); Placing a mask having a desired pattern on the quantum dot layer, and irradiating the quantum dot layer with UV light through the mask (S120); and forming a quantum dot pattern by removing a non-exposed region of the quantum dot layer (S130).

For example, as shown in FIG. 1A and FIG. 1B, the method for forming a quantum dot pattern film of the present disclosure can form the first to third quantum dot patterns 111, 121, and 131 by repeating processes S110 to S130 three times. For example, the first to third quantum dot patterns 111, 121, and 131 may be formed in parallel on the same layer on the substrate 10. For another example, the first to third quantum dot patterns 111, 121, and 131 may be laminated vertically on the substrate 10. Otherwise, as shown in FIG. 1C, the first and second quantum dot patterns 111 and 121 may be formed by repeating processes S110 to S130 twice and then the third quantum dot pattern 131 may be formed on the first and second quantum dot patterns 111 and 121. That is, the first and second quantum dot patterns 111 and 121 may be formed in parallel on the same layer and the third quantum dot pattern, 131 may be laminated vertically on the first and second quantum dot patterns 111 and 121.

Figure 5A:
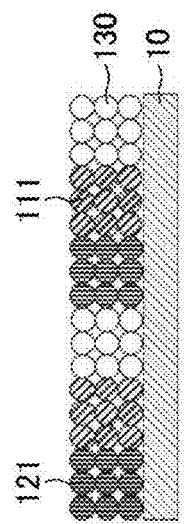
FIG. 5A to FIG. 5H illustrate detailed processes to explain the method for patterning a quantum dot thin film in accordance with various embodiments described herein, and specifically.
Figure 5D:
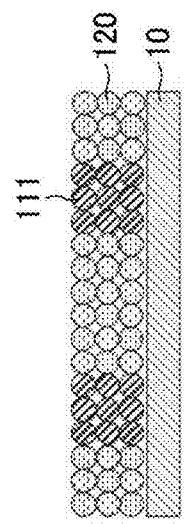
Figure 5G:
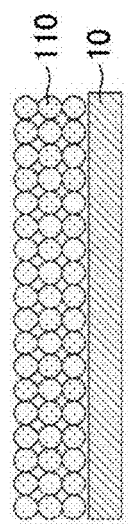
Figure 5B:
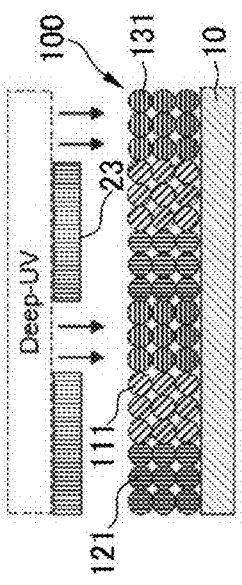
Figure 5E:
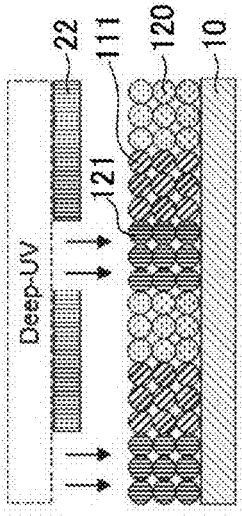
Figure 5H:
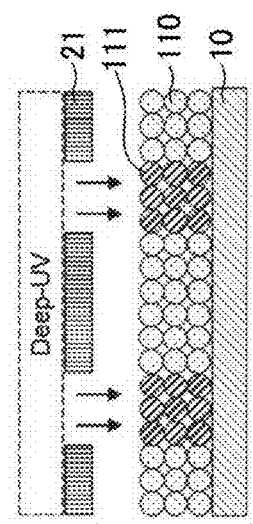
Figure 5C:
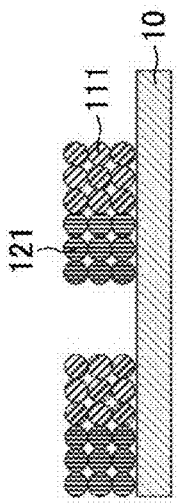
Figure 5F:
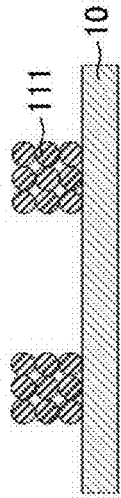

FIG. 5A to FIG. 5H illustrate detailed processes to explain the method for patterning a quantum dot thin film in accordance with various embodiments described herein, and specifically, FIG. 5A shows a first quantum dot layer formed by casting a first quantum dot solution on a substrate, FIG. 5B shows the alignment of a first mask on the first quantum dot layer and the UV irradiation, FIG. 5C shows a first quantum dot pattern after developing, FIG. 5D shows a second quantum dot layer coated on the substrate on which the first quantum dot pattern has been formed, FIG. 5E shows a second mask on the second quantum dot layer, FIG. 5F shows a second quantum dot pattern whose exposed region is hardened by cross-linking, FIG. 5G shows a third quantum dot layer coated on the substrate on which the first and second quantum dot patterns have been formed, and FIG. 5H shows a third quantum dot pattern of which a region exposed using a third mask on the third quantum dot layer is hardened by photo-crosslinking.

For example, the method for forming a quantum dot thin film illustrated in FIG. 1A includes: coating the first quantum dot solution 110 on the substrate 10 (S110); placing a first mask 21 on the first quantum dot layer 110 and performing UV exposure on the first quantum dot layer 110 to photo cross-link an exposed region of the first quantum dot layer 110 (S120); and forming the first quantum dot pattern 111 by removing a non-exposed region of the first quantum dot layer 110 (S130). The method for forming a quantum dot thin film further includes forming the second quantum dot pattern 121 and the third quantum dot pattern 131 by repeating processes S110 to S130. Herein, the first to third quantum dot layers 110, 120, and 130 refer to mixtures of the photo cross-linker containing azide groups ($N_3$) with first to third quantum dots, respectively. Further, the first to third quantum dot patterns 111, 121, and 131 are hardened by bonding the photo cross-linker 300 between two or more quantum dot ligands 200 present in the first to third quantum dot layers 110, 120, and 130, respectively.

For example, in process S110, the first quantum dot solution 110 may be coated on the substrate 10 as shown in FIG. 5A. Then, in process S120, the first pattern 21 having a predetermined pattern is placed on the first quantum dot layer 110 in which the photo cross-linker containing azide groups is mixed and UV exposure may be performed on the first quantum dot layer 110 to photo cross-link only an exposed region of the first quantum dot layer 110 as shown in FIG. 5B. Then, in process S130, the first quantum dot pattern 111 may be formed by removing a non-exposed region of the first quantum dot layer 110 with a hydrophobic solvent as shown in FIG. 5C.

The second quantum dot layer 120 may be coated on the substrate 10 on which the first quantum dot pattern 111 has been formed as shown in FIG. 5D by repeating processes S110 to S130. Then, a second mask 22 having a pattern different from the first mask 21 may be placed on the second quantum dot layer 120 in which the photo cross-linker containing azide groups is mixed and UV exposure may be performed on the second quantum dot layer 120 to photo cross-link an exposed region of the second quantum dot layer 120 as shown in FIG. 5E. Then, the second quantum dot pattern 121 may be formed by removing a non-exposed region of the second quantum dot layer 120 as shown in FIG. 5F.

The third quantum dot layer 130 may be coated on the substrate 10 on which the first and second quantum dot patterns 111 and 121 have been formed as shown in FIG. 5G by repeating processes S110 to S130. Then, a third mask 23 having a pattern different from the first and second masks 21 and 22 may be placed on the third quantum dot layer 130 in which the photo cross-linker containing azide groups is mixed and UV exposure may be performed on the third quantum dot layer 130 to photo cross-link an exposed region of the third quantum dot layer 130 and form the third quantum dot pattern 131 as shown in FIG. 5H. If the patterns of the first and second quantum dot patterns 111 and 121 match with the non-exposed region of the third mask 23, a removal process may be skipped.

Herein, the first to third masks 21 to 23 may be patterned not to overlap each other. Therefore, the first to third quantum dot patterns 111, 121, and 131 may be sequentially patterned adjacent and parallel to each other on the same layer on the substrate 10.

That is, the quantum dot thin film 100 patterned with the first to third quantum dot patterns 111, 121, and 131 may be formed on the substrate 10 by repeatedly performing the same exposure and removal processes to the first to third quantum dot solutions 110, 120, and 130 having different particle sizes with the first to third masks 21, 22 and 23 having different patterns. Therefore, the quantum dot thin film 100 of the present disclosure has chemical resistance. Thus, parallel RGB pixels can be easily implemented by continuous photo cross-linking patterning.

Figure 6B:
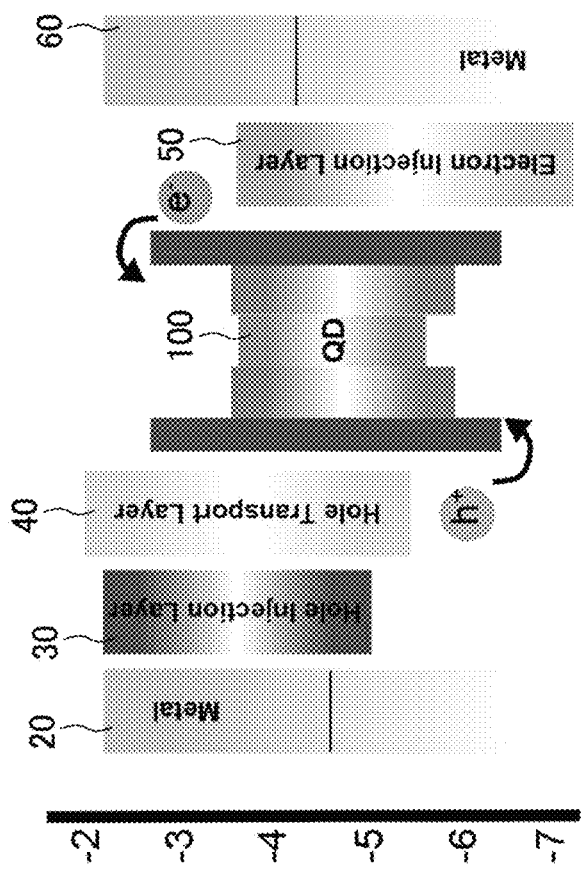
FIG. 6A and FIG. 6B are diagrams illustrating the configuration and the energy diagram of a quantum dot light emitting device manufactured using the method for patterning a quantum dot thin film in accordance with various embodiments described herein.
Figure 6A:
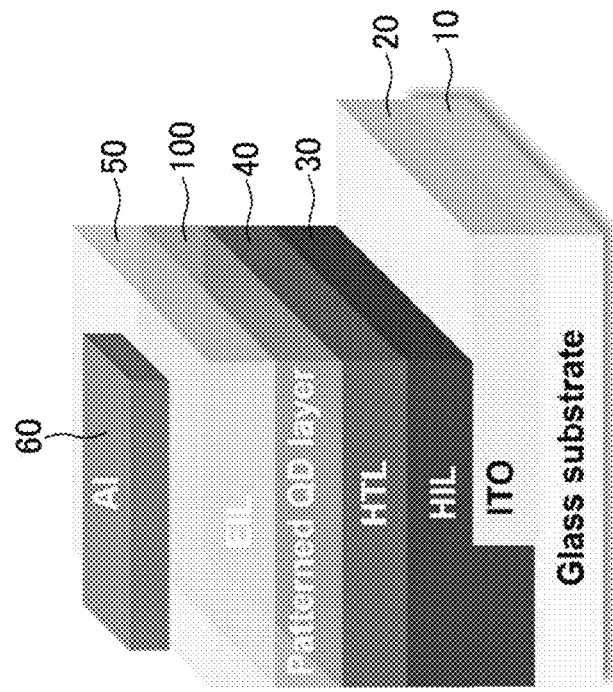

FIG. 6A and FIG. 6B are diagrams illustrating the configuration and the energy diagram of a quantum dot light emitting device manufactured using the method for patterning a quantum dot thin film in accordance with various embodiments described herein.

Referring to FIG. 6A, the quantum dot light emitting device in accordance with various embodiments described herein includes a first electrode 20, a second electrode 60 spaced from the first electrode 20, the quantum dot thin film 100 located between the first electrode 20 and the second electrode 60, a hole transport layer 40 located between the quantum dot thin film 100 and the first electrode 20, a hole injection layer 30 located between the first electrode 20 and the hole transport layer 40, and an electron injection layer 50 located between the second electrode 60 and the quantum dot thin film 100. The substrate 10 may be a transparent substrate, e.g., a glass substrate, but may not be limited thereto. The substrate 10 may be formed of various materials. The first electrode 20 may be formed of a transparent electrode material such as indium tin oxide (ITO) and the second electrode 60 may be formed of a material such as aluminum (Al).

For example, referring to FIG. 6B, a positive voltage +V may be applied to the first electrode 20 and a negative voltage −V may be applied to the second electrode 60. When these voltages are applied, electrons e− and holes h+ may be injected into the quantum dot thin film 100 and may combine to emit light in a specific wavelength range.

The quantum dot thin film 100 may be formed by bonding a photo cross-linker between two or more quantum dot ligands present in each of the first to third quantum dot solutions 110, 120, and 130.

EXAMPLES

Example 1. Preparation of Quantum Dots

Example 1-1. Preparation of Indium Phosphide Quantum Dots

Green light emitting indium phosphide core-shell quantum dots (InP/ZnSeS core-shell QD) were prepared and purified as described in the research article "InP@ZnSeS, Core@Composition Gradient Shell Quantum Dots with Enhanced Stability, *Chem. Mater.*, 23 (2011), 4459-4463".

Example 1-2. Preparation of Cadmium Selenide Quantum Dots

Red light emitting cadmium selenide core-shell quantum dots (CdSe/$Zn_{1-x}Cd_xS$ core-shell QD) were prepared and purified as described in the research article "Influence of Shell Thickness on the Performance of Light-Emitting Devices Based on CdSe/$Zn_{1-x}Cd_xS$ Core/Shell Heterostructured Quantum Dots, *Adv. Mater.*, 26 (2014), 8034-8040".

Example 2. Preparation of Photo Cross-Linker

Bis(perfluorophenyl azide) was synthesized as described in the research article "Bis(perfluorophenyl)azides: efficient crosslinking agents for deep-UV and electron beam lithography, *Chem. Mater.*, 2 (1990), 631-633", and 4,4'-diazidodiphenylethane and 2,6-bis(4-azido benzylidene)cyclohexanone were used as purchased from Alfa Chemistry (NY, USA). Since 2,6-bis(4-azido benzylidene)cyclohexanone had a moisture content of about 30%, it was used after pre-treatment for moisture removal in a vacuum oven at 70° C. for 3 hours.

Example 3. Preparation of Mixture Solution of Quantum Dots and Photo Cross-Linker The quantum dots synthesized according to Example 1 were dispersed in toluene to prepare 10 mg/ml quantum dot solutions and the photo cross-linkers synthesized or purchased according to Example 2 were dispersed in toluene to prepare 10 mg/ml photo cross-linker solutions. The prepared indium phosphide quantum dot solution and cadmium selenide quantum dot solution were mixed with the photo cross-linkers at a mass ratio of from 5 wt % to 10 wt %, respectively.

Example 4. Patterning of Quantum Dot Thin Film

A Si—$SiO_2$ wafer or glass substrate was rinsed sequentially with acetone, isopropanol and distilled water, and the mixture solution of quantum dots and photo cross-linker prepared according to Example 3 was coated on the substrate and spin-coated at a spin rate of 2000 rpm for 30 seconds to form an indium phosphide quantum dot thin film and a cadmium selenide quantum dot thin film.

A shadow mask having a predetermined pattern is located on the indium phosphide quantum dot thin film and the cadmium selenide quantum dot thin film and UV exposure was performed for 5 seconds to 10 seconds to photo cross-link the quantum dot thin films.

The quantum dot thin films were rinsed with toluene to remove a non-photo cross-linked portion.

Example 5. Manufacturing of Patterned Quantum Dot Light Emitting Diode

A hole injection layer, PEDOT:PSS(Poly(3,4-ethylenedioxythiophene), Ossila, Al 4083), was spin-coated on an ITO-coated substrate and then heat-treated at 150° C. for 30 minutes and slowly cooled to room temperature. The substrate coated with the hole injection layer was transferred into a glove box under a nitrogen atmosphere and then spin-coated with a hole transport layer, poly-TPD (Poly[N, N'-bis(4-butylphenyl)-N,N'-bis(phenyl)-benzidine], American Dye Source, ADS254BE). Poly-TPD dissolved in chlorobenzene with a concentration of 1.5 wt % was used and heat-treated at 110° C. for 30 minutes after coating and the slowly cooled to room temperature.

The mixture solution of quantum dots and photo cross-linker prepared according to Example 3 was spin-coated on the substrate coated with ITO, the hole injection layer, and the hole transport layer and a quantum dot thin film was patterned by the method as described in Example 4. A solution of ZnO nanoparticles dispersed in 30 mg/ml ethanol was coated on the patterned quantum dot thin film and heat-treated at 90° C. for 30 minutes to form an electron injection layer. Finally, aluminum (Al) was thermally evaporated to form an aluminum electrode.

Figure 7A:
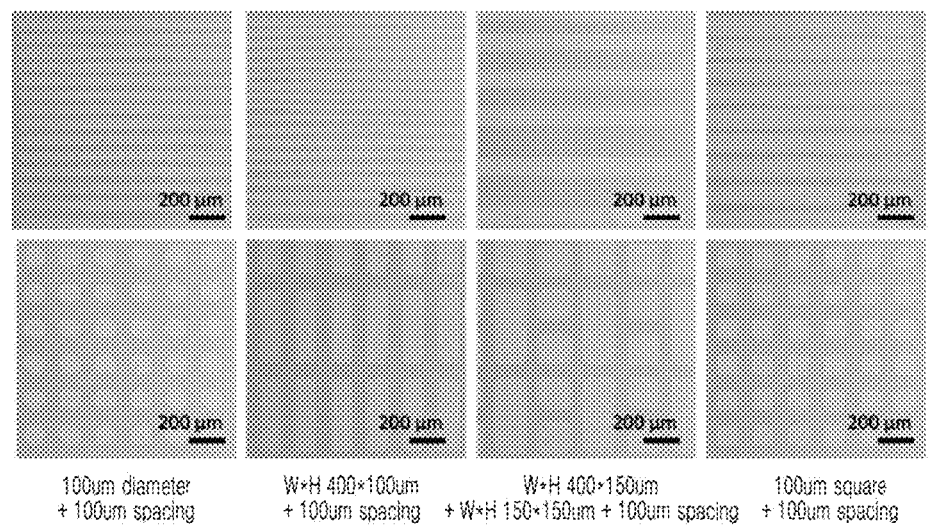
FIG. 7A to FIG. 7C are optical microscopy images of quantum dot patterns formed using different photo cross-linkers, and specifically.
Figure 7B:
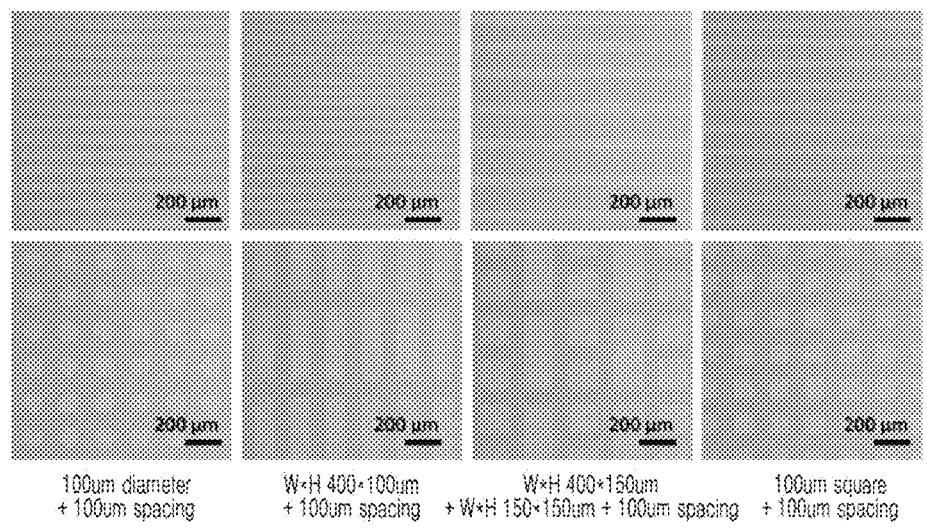
Figure 7C:
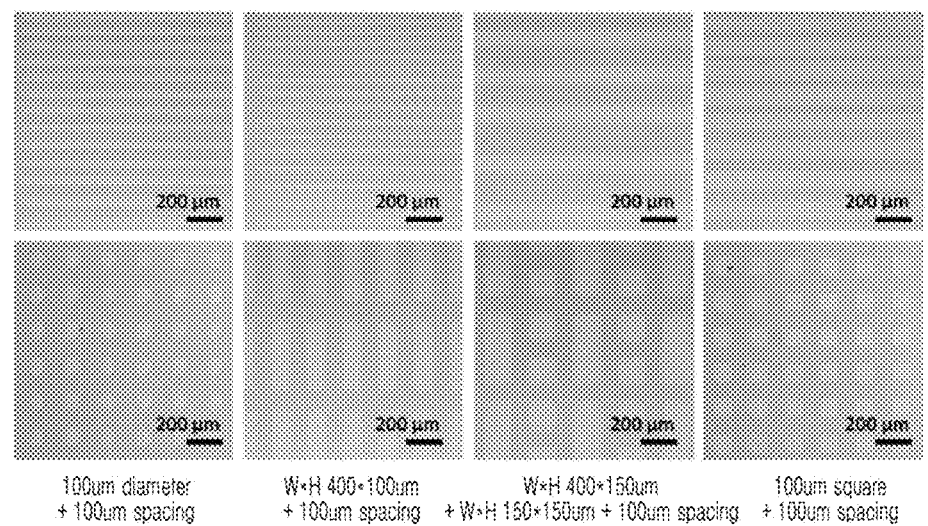

FIG. 7A to FIG. 7C are optical microscopy images of quantum dot patterns formed using different photo cross-linkers. FIG. 7A shows optical microscopy images of the patterned quantum dot thin films with various patterns prepared according to Examples 3 and 4 using the cadmium selenide quantum dots synthesized in Example 1-2 and the photo cross-linker, bis(perfluorophenyl azide), synthesized in Example 2. FIG. 7B and FIG. 7C show optical microscopy images of the patterned quantum dot thin films prepared in the same manner as those shown in FIG. 7A except that 4,4'-diazidodiphenylethane was used as a photo cross-linker for those shown in FIG. 7B and 2,6-bis(4-azido benzylidene)cyclohexanone was used as a photo cross-linker for those shown in FIG. 7C. As can be seen from FIG. 7A to FIG. 7C, when a photo cross-linker containing two or more azide groups was used, the photo cross-linker cross-linked ligands of quantum dots, and, thus, various patterns could be formed.

FIG. 8A shows fluorescence microscopy images of three quantum dot single-layer patterns formed using red emissive cadmium selenide quantum dots and three different photo cross-linkers, respectively, and FIG. 8B shows fluorescence microscopy images of three quantum dot laminated patterns respectively formed using green emissive indium phosphide quantum dots and the three different photo cross-linkers on the three quantum dot single-layer patterns shown in FIG. 8A. As shown in FIG. 8A, patterns were formed using the red emissive cadmium selenide quantum dots synthesized according to Example 1-1 and the photo cross-linkers, bis(perfluorophenyl azide), 4,4'-diazidodiphenylethane, and 2,6-bis(4-azido benzylidene)cyclohexanone, synthesized or purchased according to Example 2. Then, as shown in FIG. 8B, other patterns were deposited and formed respectively on the above-described patterns using the green emissive indium phosphide quantum dots synthesized according to Example 1-1 and the photo cross-linkers, bis(perfluorophenyl azide), 4,4'-diazidodiphenylethane, and 2,6-bis(4-azido benzylidene)cyclohexanone, synthesized or purchased according to Example 2. In this case, as can be seen from FIG. 8B, when the second patterns were formed, the shapes of the respective first patterns shown in FIG. 8A were well maintained. That is, it is possible to deposit green, red, and blue quantum dot layers by the method according to the present disclosure.

FIG. 9A to FIG. 9D are green (G) emitting electroluminescence images of a device manufactured using a quantum dot thin film including patterns of various shapes in accordance with various embodiments described herein. A quantum dot light emitting device including patterns prepared according to Examples 3 and 5 was manufactured using the indium phosphide quantum dots synthesized in Example 1-1 and the photo cross-linker, bis(perfluorophenyl azide), synthesized in Example 2, and green luminance was checked. FIG. 9A shows a circular pattern with a diameter of 100 μm, FIG. 9B shows a square pattern with a length of 100 μm, FIG. 9C shows a rectangular pattern with dimensions of 100×400 μm, and FIG. 9D shows a mixture of a rectangular pattern with dimensions of 150×400 μm and a square pattern with dimensions of 150×150 μm. For example, referring to FIG. 9A to FIG. 9D, the device was manufactured using the green quantum dots, but the present disclosure is not limited thereto. The device may also include patterns prepared according to the method of the present disclosure by using red and blue quantum dots.

Figure 10:
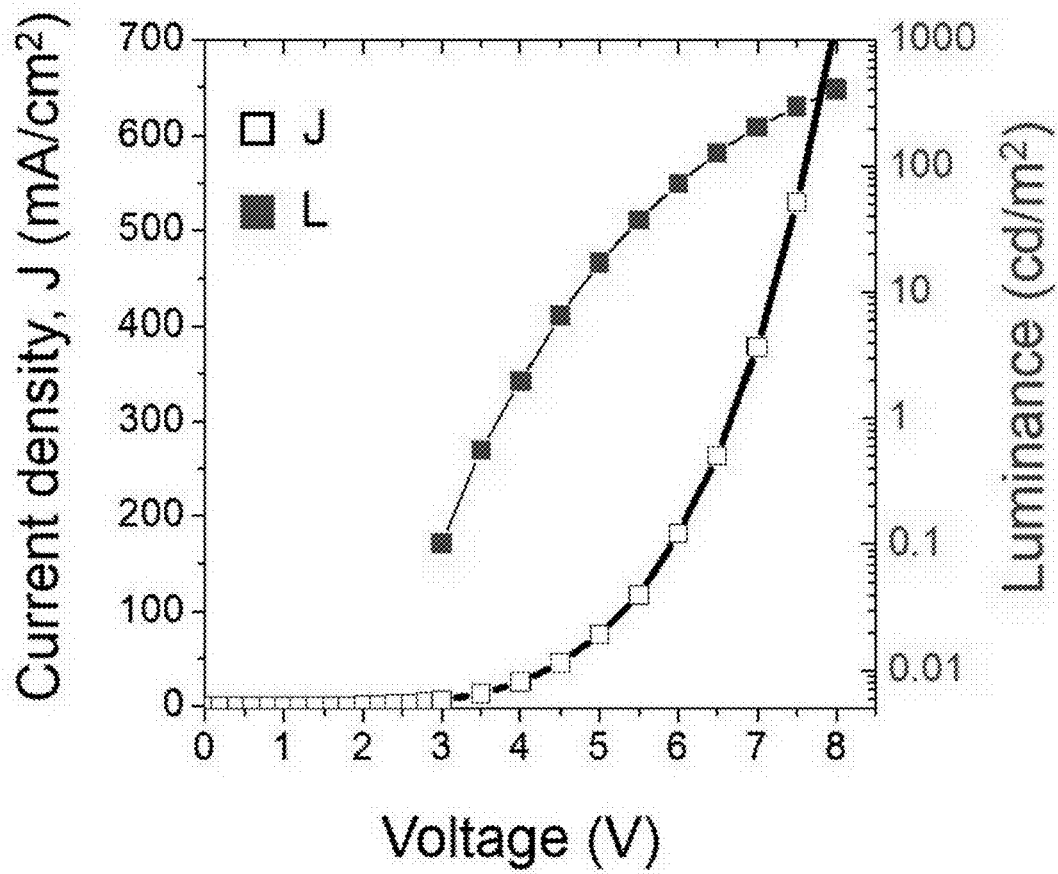
FIG. 10 is a graph showing voltage-current density-luminance curves of a quantum dot light emitting device in accordance with various embodiments described herein.

FIG. 10 is a (voltage-current density-luminance relationship) graph showing the current density and luminance of the quantum dot light emitting device (QLED) prepared in Example 5 as measured in real time while varying a driving voltage of the QLED. A voltage was applied and a current density was measured using an electrometer of Keithley (Model name: Keithley 2400) and a luminance was measured using a spectroradiometer of Photo Research Inc. (Model name: PR650).

Figure 11:
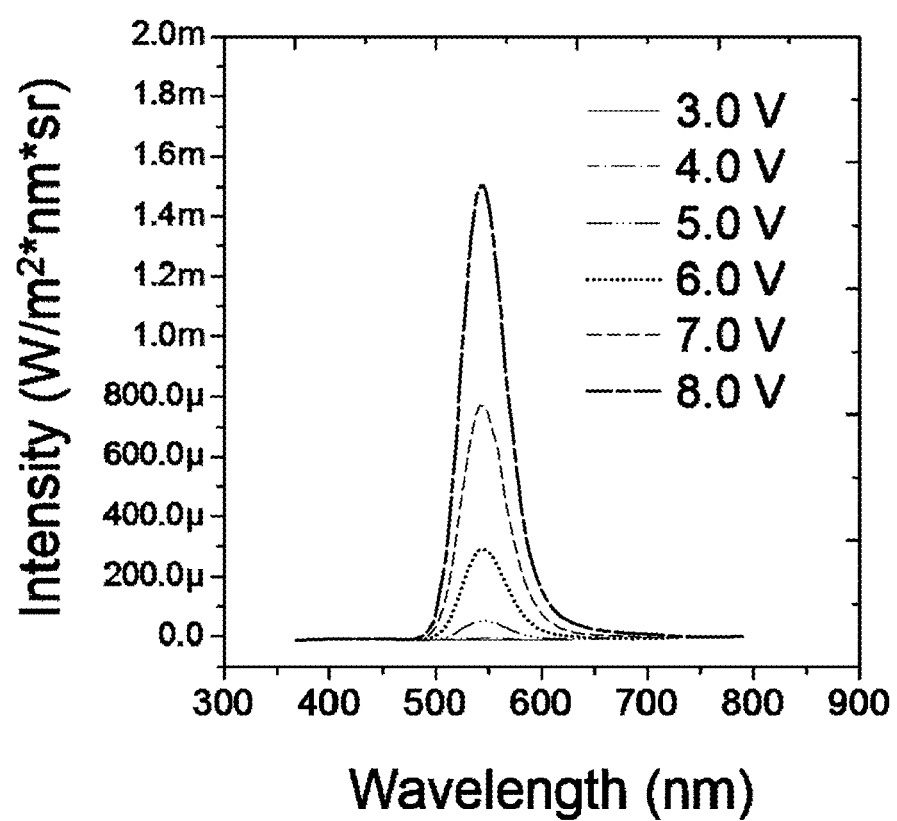
FIG. 11 is a graph showing electroluminescence spectra of the quantum dot light emitting device in accordance with various embodiments described herein.

FIG. 11 shows electroluminescence spectra of the QDLED prepared according to Example 5 as measured using a spectroradiometer of Photo Research Inc. (Model name: PR650).

Referring to FIG. 10 and FIG. 11, the quantum dot light emitting device of the present disclosure shows typical electrical properties of diode, and it can be seen that the quantum dots are self-luminous with higher color purity.

Figure 12:
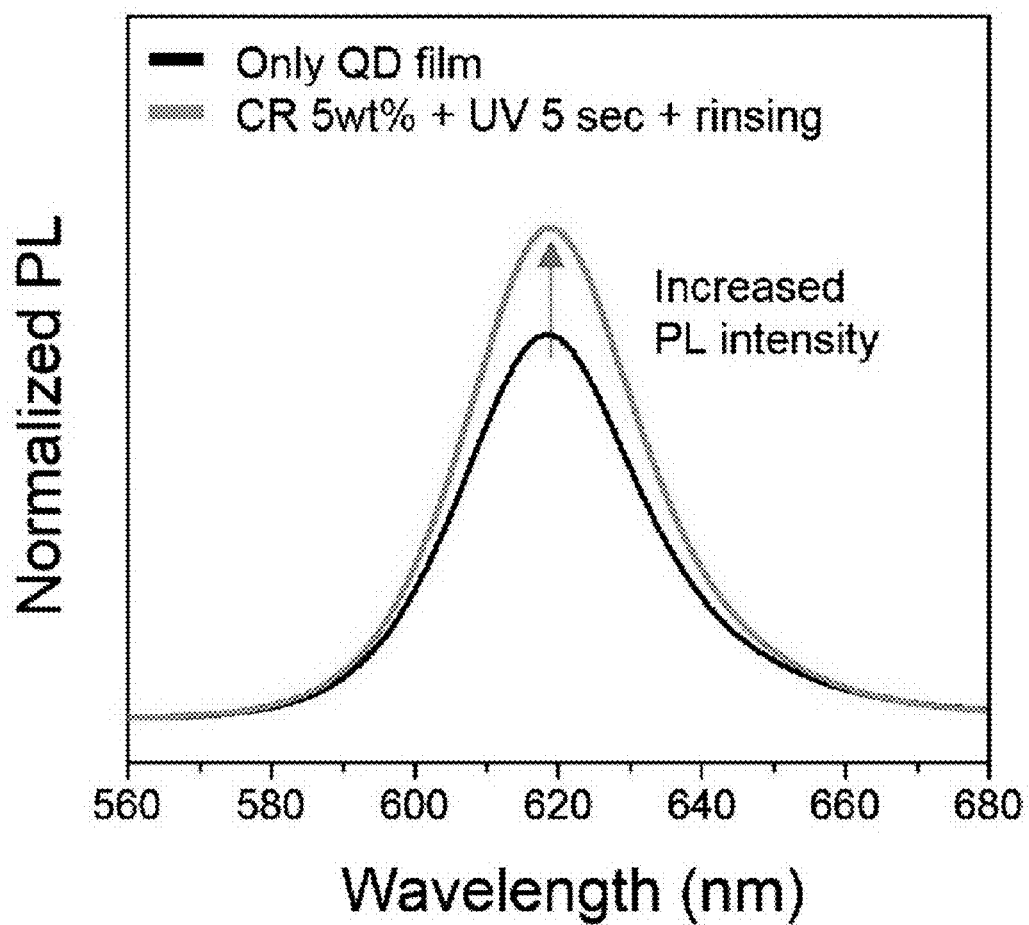
FIG. 12 is a graph comparing the photoluminescence efficiency between a quantum dot thin film formed without using a photo cross-linker and a quantum dot thin film in accordance with various embodiments described herein.

FIG. 12 is a graph comparing the luminescence efficiencies of a pure quantum dot thin film prepared without using a photo-crosslinking agent and a quantum dot thin film formed by photo-crosslinking a UV-crosslinking agent coated on a quantum dot solution. The crosslinking agent is according to various embodiments described herein. As can be seen from FIG. 12, the quantum dot thin film of the present disclosure has an increased luminous efficiency compared to the pure quantum dot thin film. This may be because the photo cross-linker of the present disclosure increases a distance between quantum dots and the formed quantum dot thin film has an increased luminous efficiency.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

10: Substrate
20: First electrode
30: Hole injection layer
40: Hole transport layer
50: Electron injection layer
60: Second electrode
21: First mask
22: Second mask
23: Third mask
100: Quantum dot thin film
110: First quantum dot solution, First quantum dot layer
111: First quantum dot pattern
120: Second quantum dot solution, Second quantum dot layer
121: Second quantum dot pattern
130: Third quantum dot solution, Third quantum dot layer
131: Third quantum dot pattern
200: Ligand
300: Photo cross-linker

We claim:

1. A quantum dot thin film, comprising:
   quantum dots,
   wherein the quantum dots are linked by cross-linking ligands surrounding the quantum dots with a photo cross-linker containing two or more azide groups, and,
   wherein a distance between the quantum dots is increased by the ligands and the photo cross linker.

2. The quantum dot thin film of claim 1,
   wherein the quantum dot thin film is patterned with a first quantum dot pattern, a second quantum dot pattern, and a third quantum dot pattern.

3. A quantum dot light emitting device, comprising:
   a first electrode;
   a second electrode spaced from the first electrode; and
   the quantum dot thin film according to claim 1 which is located between the first electrode and the second electrode.

4. A substrate on which a quantum dot pattern is formed, comprising:
   a quantum dot thin film patterned with a first quantum dot pattern, a second quantum dot pattern, and a third quantum dot pattern on the substrate,
   wherein the quantum dot thin film includes quantum dots,
   wherein the quantum dots are surrounded by ligands,
   wherein the ligands surrounding the quantum dots are cross-linked by a photo cross-linker containing two or more azide groups, and,
   wherein a distance between the quantum dots is increased by the ligands and the photo cross linker.

5. The substrate of claim 4,
wherein the first to third quantum dot patterns include first to third quantum dots having different sizes.

6. The substrate of claim 5,
wherein the first to third quantum dots emit light of red (R), green (G), and blue (B) colors, respectively.

7. The substrate of claim 5,
wherein the first to third quantum dot patterns are formed in parallel on the same layer on the substrate.

8. The substrate of claim 5,
wherein the first to third quantum dot patterns are laminated vertically on the substrate.

9. The substrate of claim 5,
wherein the first and second quantum dot patterns are formed in parallel on the same layer on the substrate and the third quantum dot pattern is formed on the first and second quantum dot patterns.

* * * * *